Figure 1:
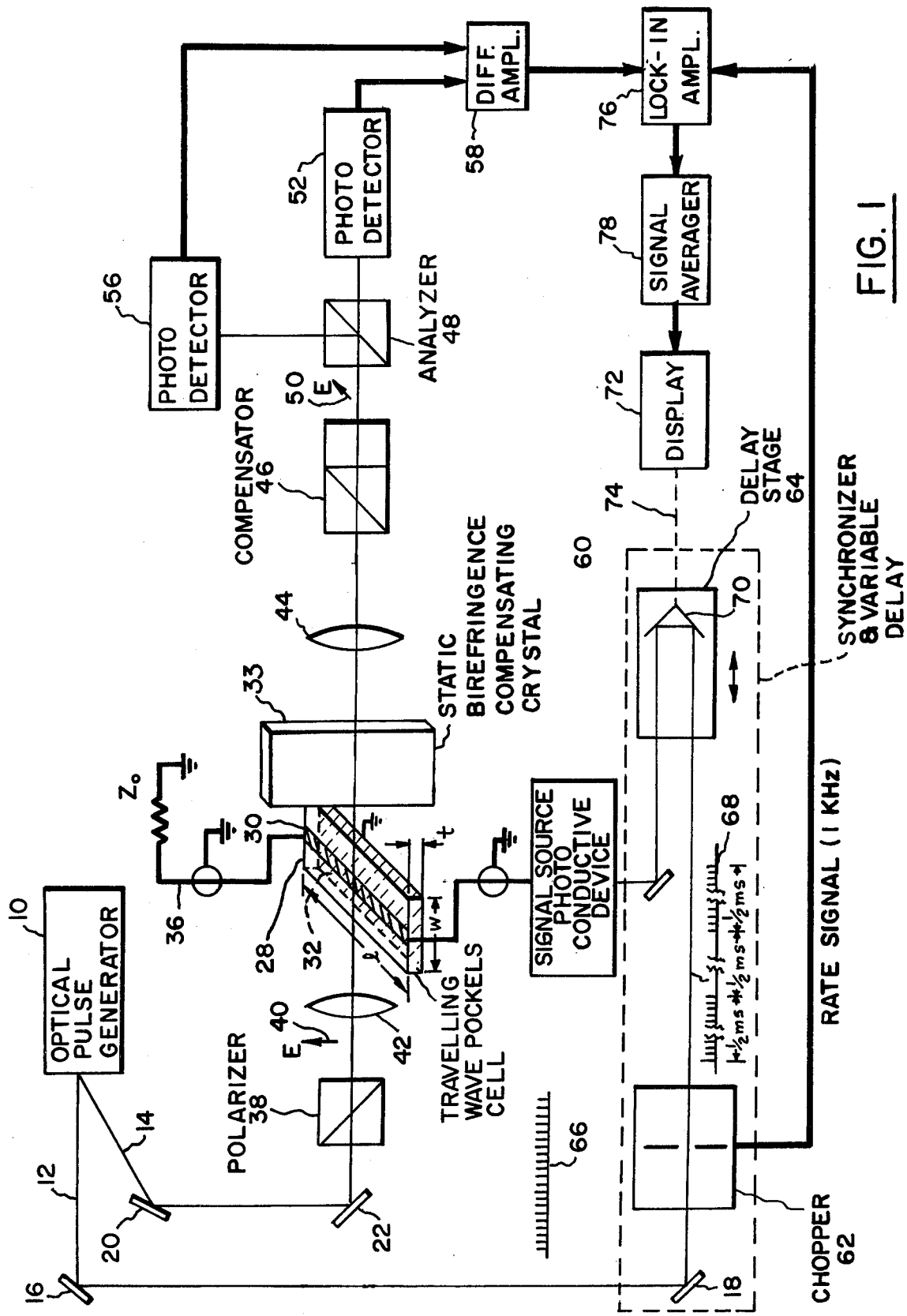

United States Patent [19]

Valdmanis et al.

[11] 4,446,425

[45] May 1, 1984

[54] MEASUREMENT OF ELECTRICAL SIGNALS WITH PICOSECOND RESOLUTION

[75] Inventors: Janis A. Valdmanis, Columbus, Ind.; Gerard Mourou, Rochester, N.Y.

[73] Assignee: The University of Rochester, Rochester, N.Y.

[21] Appl. No.: 348,127

[22] Filed: Feb. 12, 1982

[51] Int. Cl.³ ............................................ G01R 23/16
[52] U.S. Cl. .................................... 324/77 K; 324/96; 350/385
[58] Field of Search ............... 350/355, 374, 384, 385, 350/393; 324/77 K, 96; 370/2; 332/7.51

[56] References Cited

U.S. PATENT DOCUMENTS 3,532,891 10/1970 Simmons et al. ..................... 350/393
3,614,451 10/1971 Gunn ..................................... 350/385
3,707,329 12/1972 Jaecklin et al. ........................ 324/96

OTHER PUBLICATIONS

T. K. Gustafson, "Self-Modulation of Picosecond Pulses in Electro-Optic Crystals", Optics Communications, vol. 2, No. 1, May/Jun. 1970, pp. 17-21.

Primary Examiner—Michael J. Tokar
Attorney, Agent, or Firm—Martin LuKacher

[57] ABSTRACT

Electrical signals are measured (analyzed and displayed) with picosecond resolution by the electrooptic sampling of the signal being analyzed in a traveling wave Pockels cell. Sampling pulses, from an optical pulse generator such as a colliding pulse mode-locked laser, of subpicosecond duration are transmitted through the cell as polarized light and translated into a difference output corresponding to the difference in amplitude between the transmitted and rejected components of the polarized light. The signals, synchronous with the optical sampling pulses, are generated to propagate along the cell in a direction transverse to the transmission of the optical sampling pulses and in variably delayed relationship therewith. A separate beam of the optical pulses is desirably chopped and used to activate a photoconductive device which produces the signals. The difference output is processed, preferably by a lock-in amplifier and signal averager; the lock-in amplifier being synchronized with the chopping of the launched pulses, and displayed on a time base synchronous with the variable delay of the pulses. Accordingly, the signal is displayed on an expanded time scale for measurement and other analysis. The response of photodetectors, photoconductive switches and other ultrafast light activated devices can be determined, when these devices are used as the source of the signals being analyzed and displayed.

22 Claims, 3 Drawing Figures

MEASUREMENT OF ELECTRICAL SIGNALS WITH PICOSECOND RESOLUTION

DESCRIPTION

The present invention relates to a system for the measurement of electrical signals with picosecond resolution, and particularly to a signal analyzer and display system with picosecond electrooptic sampling of the signal being analyzed.

The invention is especially suitable for measurement of small (millivolt amplitude) transient signals, such as are produced by picosecond photodetectors, photoconductive switches and other ultrafast devices and enables the characterization of the response of such signals with picosecond accuracy.

The measurement of ultrafast electrical signals has been difficult to accomplish. Sampling oscilloscopes have been used, but are limited in temporal resolution by their electronic sampling window which is typically, approximately 25 picoseconds. It has been suggested that amorphous semiconductors may be switched fast enough to resolve electrical transients as short as 5 to 10 picoseconds (see D.H. Auston, et al., Appl. Phys. Lett. 37, 371, 1980). The resolution of the measurement is constrained by the material recovery time which is approximately 10 picoseconds. The response of electrooptic switch/modulators themselves has been measured with picosecond optical sampling pulses according to an article by Alferness, et al., Appl. Phys. Lett. 37(7), 597, 1980, but not for the display and analysis of electrical signals generally. It has been suggested to use electrooptic techniques for sampling an electrical signal wherein the signal and light beam propagate in the same direction along a crystal (see, Gunn, U.S. Pat. No. 3,614,451, issued Oct. 19, 1971; however resolution of a measurement in the picosecond range has not been described.

It is an object of the present invention to provide an improved system for the measurement of electrical signals electrooptically with high resolution both temporally and in amplitude (e.g., temporal resolution in the picosecond range and sensitivity less than 100 microvolts minimum).

It is another object of the present invention to provide an improved system which enables the analysis and display of signals having very broad bandwidths (e.g., 20 GHz and higher) such that changes in amplitude (e.g., rise times in the picosecond range—such as less than 20 picoseconds) can be displayed and analyzed.

It is still another object of the present invention to provide a system having extremely high sensitivity (e.g., less than 100 microvolts minimum sensitivity) for the analysis and display of electrical signals, with high temporal resolution (e.g., in the picosecond range).

It is a further object of the present invention to provide an improved system for the characterization of the response of optically activated devices such as photodetectors and photoconductive switches which are ultrafast in operation (e.g., are activated in picoseconds).

It is a still further object of the present invention to provide an improved system for the measurement of electrical signals by electrooptic sampling using the Pockels effect.

It is a still further object of the present invention to provide an improved signal analysis and display system using electrooptic sampling wherein limitations in resolution, both temporally and in amplitude, due to the electrooptic sampling device are reduced.

Briefly described, a system for measurement of an electrical signal with picosecond resolution, which embodies the invention, makes use of means including a traveling wave Pockels cell for electrooptically sampling successively occurring portions of the signal. Means for processing the samples are used to provide a display of the signal on a time base which is proportional to, but much longer than, the duration of the signal so that it can be analyzed and otherwise measured.

Figure 2:
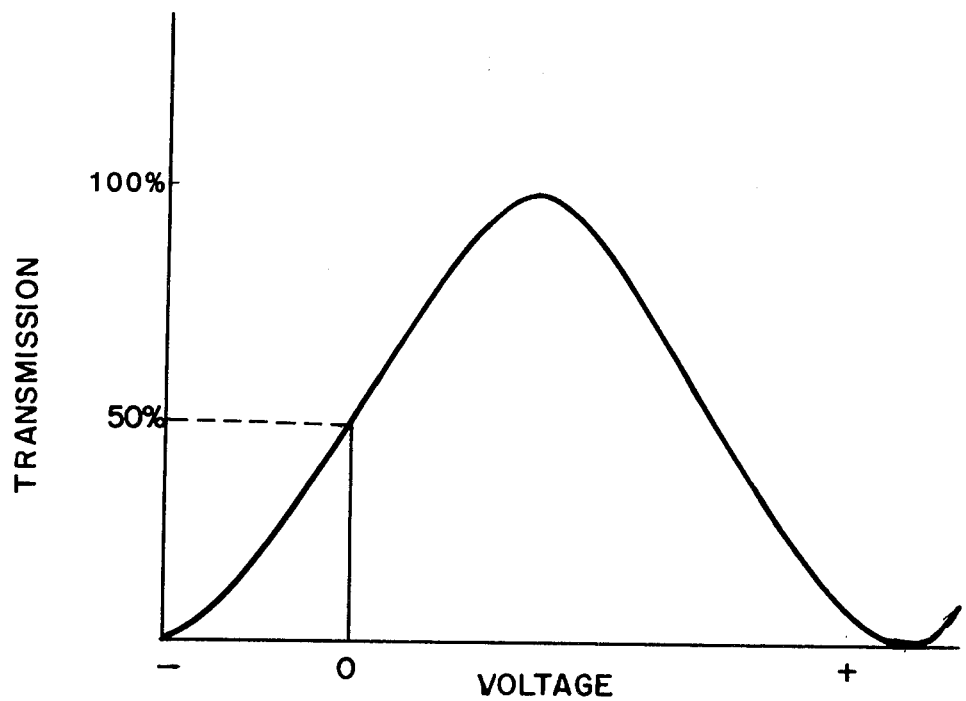
Figure 3:
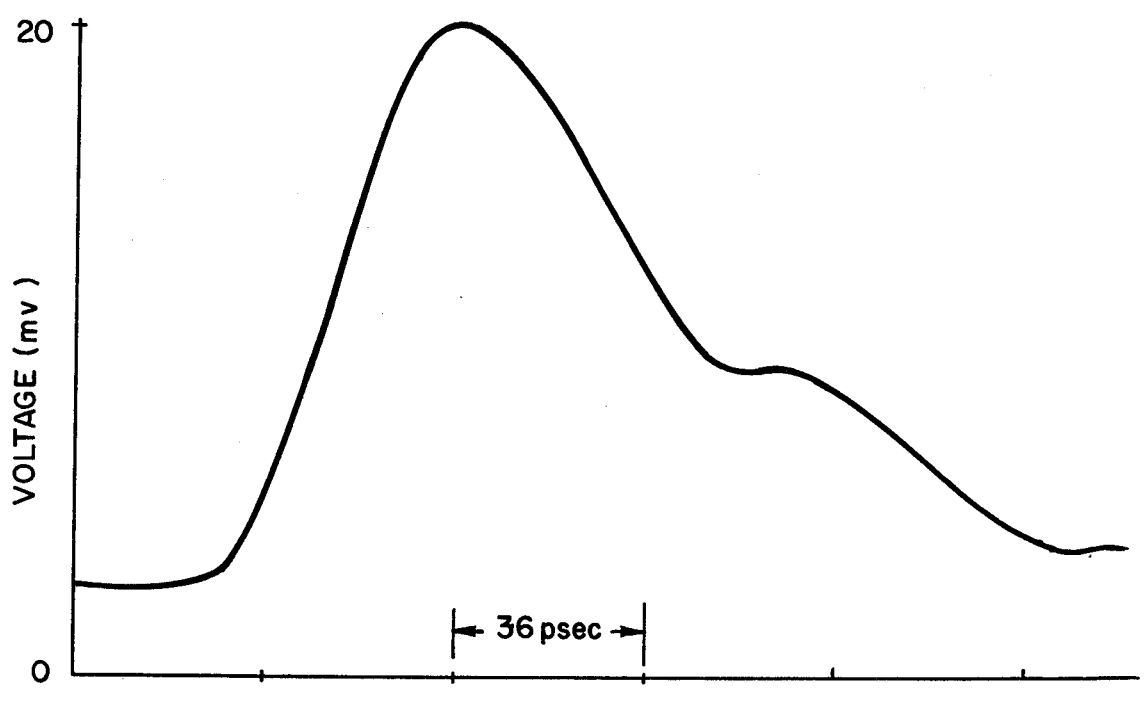

The foregoing and other objects, features and advantages of the invention, as well as a presently preferred embodiment thereof, will become more apparent from a reading of the following description in connection with the accompanying drawings in which:

FIG. 1 is a block diagram schematically illustrating an electrooptic system for the measurement of electrical signals with picosecond resolution which embodies the invention;

FIG. 2 is a transmission curve of the electrooptic sampler which includes the polarization means and the traveling wave Pockels cell shown in FIG. 1; and FIG. 3 is a display of a typical electrical signal, namely the response of a chromium doped gallium arsenide photoconductive solid state switch detector of the type described in U.S. Pat. No. 4,218,618 issued Aug. 19, 1980 to G. Mourou.

Referring more particularly to FIG. 1, an optical pulse generator 10 generates and transmits separate trains of simultaneously occurring pulses along separate paths 12 and 14 defined by mirrors 16, 18, 20 and 22. The generator 10 is a laser, preferably a CW mode-locked ring dye laser which is pumped by a CW Argon laser. The ring laser operates as a colliding pulse mode-locked (CPM) laser which produces its pulses and propagates them along the paths 12 and 14. Any laser which produces subpicosecond pulses may be used. The pulses in this embodiment may be at a wave length of 6150 Angstroms; the laser pump being at 5145 Angstroms. The pulses are repetitive at a rate of 100 MHz and are of subpicosecond duration, e.g., 120 femtoseconds.

The path 14 is through an electrooptic sampling channel 24 and is for the optical sampling pulses. The pulses which propagate along the path 12 are used to synchronize the generation and propagation of the signals which are to be measured. These pulses drive a signal source 26 which, in this embodiment, is a photoconductive device. The system is operative to characterize the response of that device. Any signals which are produced or switched for electrooptic sampling in synchronism with the optical sampling pulses which are transmitted through the channel 24 may be measured by means of the system. When the signal source 26 is a photoconductive device such as a solid state light actuated switch, it is directly activated by the optical pulses. The signals which are measured are therefore automatically synchronized with the optical sampling pulses.

For the sampling channel 24, a traveling wave Pockels cell 28 is used. This cell is a crystal of birefringent material which has an index of refraction proportional to the electrical field established therein. The crystal is preferably composed of Lithium Niobate. Lithium tantalate ($LiTaO_3$) crystals may also be used. The crystal is rectangular and has a length in the direction of propagation of the electrical signal therein, 1; a width w in the direction of transmission of the optical pulses therethrough, and a thickness t. Using a crystal where 1, w, and t are approximately 10 millimeters, 1.5 millimeter, and 0.7 millimeter, respectively, signals having a bandwidth of at least 17 GHz have been measured with the minimum sensitivity of 100 microvolts. Since the sensitivity is proportional to the ratio of the width to the thickness, and the fundamental bandwidth is inversely proportional to the width (the time the optical sampling pulse is in the cell), the reduction of the width and thickness dimensions can provide a bandwidth over 50 GHz without degradation of the sensitivity. It will be seen therefore that the temporal resolution of the system is very high and is not limited by the materials used in the cell.

The electrical field from the signal source propagates along the length of the cell on a balanced strip transmission line provided by a strip electrode 30 and a ground strip electrode 32 on opposite faces of the cell across the thickness thereof. The signal source 26 is coupled to the strip line by means of a coaxial cable 34 which desirably provides an impedance match between the source and the strip line. Other broadband coupling means may be used. The strip line is terminated by a resistance $Z_O$ which is matched to the strip line impedance and is connected thereto by another coaxial cable 36. A signal is launched and propagates along the length of the cell each time the source is activated by an optical pulse.

The sampling pulses pass through a polarizer 38 to produce linearly polarized light as shown by the E vector 40. This light is focused into a narrow beam by a lens 42. The optical pulses of polarized light sample the amplitude of the electrical field in the crystal due to the propagating signal and change its polarization. In other words, the change in polarization varies as a function of the amplitude of the signal.

A second crystal 33 identical to the first, but without electrodes, is placed adjacent to the first crystal so that its ordinary and extraordinary axes are interchanged with those of the first crystal. This eliminates static birefringent effects. The beam transmitted through the crystals 28 and 31 is collimated by another lens 44 and passes through a compensator 46 and an analyzer 48. The compensator 46 interposes an additional variable birefringence such that in the absence of a signal on the cell 28 circularly polarized light reaches the analyzer 48. This is indicated by the E vector 50 ahead of the analyzer.

The compensator thus biases the modulator arrangement at its quarter wave point. This is shown in FIG. 2 where the curve represents the transmission response of the system as a function of the voltage which produces the electrical field across the thickness of the cell. The compensator causes the system to operate on the steep slope of the transmission characteristic. It is possible to use DC bias on the strip line to provide the biasing of the system or the combination of DC bias and a compensator which, together with the bias, results in a change of polarization in the cell 28 and in the compensator 46 such that circularly polarized light reaches the analyzer 48.

Separate photodetectors 52 and 56 obtain separate outputs corresponding to orthogonal, linear components of the polarized light which reach the analyzer. The transmitted component (E vector perpendicular to E vector 40) reaches the photodetector 52 and the rejected component (E vector parallel to E vector 40) reaches the photodetector 56. In the absence of an electrical signal, the outputs of the photodetectors will be equal. A difference amplifier 58 which responds to the difference between the photodetector outputs will then produce an essentially zero output. When the signal propagates, this difference output changes, since the components of the polarized light reaching the analyzer change in opposite directions with a single component either increasing or decreasing depending upon the polarity of the signal as it propagates along the strip line.

A variable delay 60 enables the optical pulses transmitted through the channel 24 to sample successive portions of the signal. The variable delay 60 includes a delay stage 64 through which pass the optical pulses synchronous with the sampling pulses in the channel 24 and in the cell 28.

The delay stage is reciprocated along the linear path at a constant rate, for example, one centimeter per second. The delay stage uses a corner reflector 70 which provides a double pass of the optical pulses before reaching the signal source 26. Since a travel of 1 millimeter of the delay stage 64 produces approximately a 6 picosecond delay, the pulses reaching the signal source 26 will be variably delayed. The signal is generated repeatedly each time a pulse reaches the signal source. Since the optical pulses are variably delayed, different portions of the signal will be coincident with the optical sampling pulse which is transmitted through the cell 28 as the delay stage travels, say from left to right, as viewed in FIG. 1. The rate of travel of the delay stage 60 is synchronous with the time base in the display 72, since the delay stage is coupled to the display as indicated schematically by the dash line 74. In the event that the display is an oscilloscope, the horizontal sweep which defines the time base is locked to the displacement of the stage 64. For example, a ramp voltage which drives the motor or electromechanical actuator which moves the delay stage may be used to control the horizontal sweep. Accordingly, the time of the sweep is proportional to the variable delay of the signals which are launched into the cell 28. The display is therefore a temporally enlarged replica of the signal.

A chopper 62 is used to encode the electrical signal applied to the crystal by effectively turning the signal on and off at typically a 1 KHz rate. The chopper 62 may be a commercially available rotating disc chopper which chops the optical pulses into successive groups at a 1 KHz rate. The train of optical pulses which propagates along the path 12 is repetitive at 100 MHz or 10 nanosecond intervals. This train is shown at 66. It is chopped into groups which are repetitive at a 1 KHz rate. Each group is ½ millisecond long as shown at 68. The chopper produces a rate signal synchronous with these groups of optical pulses. A lock-in amplifier, 76 tuned to the same frequency, then extracts that 1 KHz signal proportional to the signal amplitude on the crystal, thus increasing the signal to noise ratio very effectively.

The signal is applied to the display by a signal averager 78 which is operative to further reduce the noise and increase the sensitivity of the measurement. A lock-in amplifier suitable for use in the system may include the difference amplifier 58 as the preamplifier thereof. Such a lock-in amplifier is commercially available from EG&G., Princeton Applied Research of Princeton, N.J. (for example, their model 124A). The signal averager is also available from the same source, for example, their model 4202 or 4203.

FIG. 3 shows the response characteristic of a chromium doped gallium arsenide photoconductive switch, when such a switch has a 90 micrometer gap biased at 40 volts. The switch is activated by the optical pulses transmitted through the chopper and variable delay 60. The optical energy of each pulse may be 0.1 nano-Joule. FIG. 3 shows that the rise time of the signal is 21 picoseconds and the full width half magnitude is 65 picoseconds. The displayed rise time is due to the convolved bandwith limiting effects of the striplines, coaxial connectors, and optical sampling time of the geometry in the herein illustrated embodiment. These can readily be improved to enhance bandwith and sensitivity.

From the foregoing description it will be apparent that there has been provided an improved system for measurement of electrical pulses with a temporal response in the picosecond range at a sensitivity in the microvolt range. Variations and modifications in the herein described system, within the scope of the invention, will undoubtedly suggest themselves to those skilled in the art. For example, higher resolutions (bandwidths over 50 GHz) and sensitivities better than 100 microvolts may be obtained by reducing the w and t dimensions of the crystal in the cell 28. Accordingly, the foregoing description should be taken as illustrative and not in a limiting sense.

We claim:

1. A system for measurement of an electrical signal with picosecond resolution which comprises means including a traveling wave Pockels cell for electrooptically sampling successively occurring portions of said signal with optical pulses which propagate through the cell transversely to the direction of the propagation of the electrical signal, and means for processing the samples to provide a display of said signal.

2. The system according to claim 1 wherein said traveling wave Pockels cell is a crystal of electrooptic, birefringent material having a stripline thereon along which said signal propagates to produce an electric field accessible to the optical sampling pulses which are transmitted therethrough transversely to said stripline.

3. The system as set forth in claim 2 wherein said crystal is selected from Lithium Niobate and Lithium Tantalate.

4. The system according to claim 2 wherein said crystal is rectangular and has its length in the direction of propagation of said signal longer than its width in the direction of transmission of said optical sampling pulses therethrough, said strip line comprising electrodes on opposed faces of said crystal perpendicular to the faces thereof which define said width, said opposed faces defining the thickness of said crystal, and another crystal for compensation of static birefringence adjacent to said first named crystal.

5. The system according to claim 1 wherein said electrooptical sampling means further comprises means for producing and transmitting optical sampling pulses through said cell, and means operated by said optical sampling pulses for generating said signal for propagation along said cell in synchronism with said optical sampling pulses.

6. The system according to claim 5 further comprising means for chopping repetitively at a substantially constant rate said optical pulses with which the generating of said signal is synchronous, and means for operating said processing means in synchronism with said chopping means.

7. The system according to claim 5 wherein said generating means comprises means for variably delaying the generation of said signal with respect to said optical sampling pulses which are transmitted through said cell, and means for activating the generating of said signals with said variably delayed signal generating train of said optical pulses.

8. The system according to claim 7 wherein said variable delaying means comprises means for providing separate trains of said optical pulses for transmission through said cell and for generating said signals, and means for variably delaying the optical pulses in said signal generating train.

9. The system according to claim 7 wherein said signal is provided by a signal source including a photoconductive device which produces said signal repeatedly in response to each of said optical pulses.

10. The system according to claim 9 wherein said optical sampling pulses producing means comprises laser means for continuously generating optical pulses at a certain rate and having a duration shorter than the interval therebetween.

11. The system according to claim 10 wherein said laser is a mode-locked laser having means for producing said optical pulses at said certain rate which is of the order of 100 MHz and with said duration of the order of 100 femtoseconds.

12. The system according to claim 10 wherein means are provided for directing said pulses from said laser means along a first path through said cell and a second path to said signal generation means to synchronize the repetitions of said signal with successive ones of said optical pulses.

13. The system according to claim 1 wherein said electrooptical sampling means comprises means including said cell for producing approximately equal intensities of orthogonal components of polarized light in the absence of said signal, and means for providing separate outputs corresponding to different ones of said components to said processing means.

14. The system according to claim 13 wherein said means for producing said components of polarized light includes an optical pulse generator, polarizer means, analyzer means, said polarizer and analyzer means being disposed on opposite sides of said cell in the path of the transmission of light through said cell, compensator means between said cell and said analyzer means for varying the polarization of the light transmitted through said cell, and separate photodetectors responsive to the orthogonal components of polarized light transmitted by said analyzer for producing said separate outputs.

15. The system according to claim 14 wherein said processing means comprises means responsive to said separate outputs for processing an output corresponding to the amplitude difference thereof.

16. The system according to claim 15 wherein said processing means comprises lock-in amplifier means operated synchronously with said signals for processing said difference output.

17. The system according to claim 16 further comprises means for transmitting said light in the form of optical sampling pulses through said polarizer means, said cell, said compensator and said analyzer means to said photodetectors, means for propagating said signal across said cell synchronously and in variably delayed relationship with said optical sampling pulses and in successive groups which are repetitive at a certain rate, and means for locking said lock-in amplifier with said successive groups to operate said lock-in amplifier synchronously with said signals.

18. The system according to claim 17 further comprising signal averager means operative upon said difference output after processing in said lock-in amplifier means.

19. The system according to claim 18 further comprising means for displaying difference output after averaging in said signal averager means during a period of time proportional to and synchronous with the variable delay of said signals.

20. A system for measurement of an electrical signal with picosecond resolution which comprises means including a traveling wave Pockels cell for electrooptically sampling successively occurring portions of said signal and providing said samples in a beam leaving said cell, a crystal disposed in said beam leaving said cell for compensation of static birefringence, and means for processing the samples to provide a display of said signal.

21. The system according to claim 20 wherein said Pockels cell is a crystal of electrooptic, birefringent material which is rectangular and has its length in the direction of propagation of said signal longer than its width in the direction of transmission of said optical sampling pulses therethrough.

22. The system according to claim 21 wherein said crystal has a stripline thereon along its length along which said electrical signal propagates to produce an electric field accessible to the optical sampling pulses which are transmitted along the width of said crystal.

* * * * *